(12) United States Patent
Hayes

(10) Patent No.: US 8,792,537 B2
(45) Date of Patent: Jul. 29, 2014

(54) METHOD OF REDUCING EMISSION OF ELECTROMAGNETIC RADIATION ON HIGH SPEED COMMUNICATION BACKPLANE

(75) Inventor: Daniel Martin Hayes, Tring (GB)

(73) Assignee: Cisco Technology, Inc., San Jose, CA (US)

( * ) Notice: Subject to any disclaimer, the term of this patent is extended or adjusted under 35 U.S.C. 154(b) by 675 days.

(21) Appl. No.: 13/006,981

(22) Filed: Jan. 14, 2011

(65) Prior Publication Data

US 2011/0176587 A1    Jul. 21, 2011

Related U.S. Application Data

(60) Provisional application No. 61/295,370, filed on Jan. 15, 2010.

(30) Foreign Application Priority Data

Jan. 15, 2010    (NO) ..................................... 20100064

(51) Int. Cl.
*H04B 1/38* (2006.01)

(52) U.S. Cl.
USPC ........................... 375/219; 455/63.1; 713/500

(58) Field of Classification Search
USPC .......................... 375/219, 257; 713/189, 500; 318/400.25; 455/63.1
See application file for complete search history.

(56) References Cited

U.S. PATENT DOCUMENTS

| | | | |
|---|---|---|---|
| 5,504,776 A | | 4/1996 | Yamaura et al. |
| 5,894,517 A | * | 4/1999 | Hutchison et al. ............ 713/189 |
| 2004/0190602 A1 | | 9/2004 | Lomp |
| 2006/0018388 A1 | | 1/2006 | Chan |
| 2007/0072549 A1 | * | 3/2007 | Carolan ....................... 455/63.1 |
| 2007/0103883 A1 | | 5/2007 | Wu et al. |
| 2010/0233908 A1 | * | 9/2010 | Tseng ..................... 439/620.21 |

FOREIGN PATENT DOCUMENTS

WO    WO2005027344    *   7/2005    ............... H03H 9/00

OTHER PUBLICATIONS

Norwegian Search Report issued Jul. 8, 2010, in Norway Patent Application No. 20100064, filed Jan. 15, 2010.
International Type Search Report issued Jun. 30, 2010, in Norway Patent Application No. 20100064, filed Jan. 15, 2010.

* cited by examiner

*Primary Examiner* — Daniel Washburn
*Assistant Examiner* — Eboni Hughes
(74) *Attorney, Agent, or Firm* — Oblon, Spivak, McClelland, Maier & Neustadt, L.L.P.

(57) ABSTRACT

A method is provided that includes transmitting data to a backplane from a first communication module simultaneously on a first pair of operating frequencies, where the first pair of operating frequencies includes first and second operating frequencies. The method further provides that a −3 dB point of a first electromagnetic emission spectrum peak originating from transmission of the data at the first operating frequency is outside a −3 dB point of a second electromagnetic emission spectrum peak originating from transmission of the data at the second operating frequency.

20 Claims, 4 Drawing Sheets

|  | Operational frequency (Mbps) | Reference clock frequency (MHz) |  |
|---|---|---|---|
| LOF_P1 | 6382.4 | 398.9 | RefClk_P1L |
| HOF_P1 | 6385.6 | 399.1 | RefClk_P1H |
| LOF_P2 | 6414.4 | 400.9 | RefClk_P2L |
| HOF_P2 | 6417.6 | 401.1 | RefClk_P2H |

| Destination | 1 | 2 | 3 | 4 | 5 | 6 | 7 | 8 | 9 | 10 |
|---|---|---|---|---|---|---|---|---|---|---|
| Source | | | | | | | | | | |
| 1 | 399 | 399 | 401 | 399 | 401 | 399 | 401 | 399 | 401 | 399 |
| 2 | 401 | 401 | 401 | 401 | 401 | 401 | 401 | 401 | 401 | 401 |
| 3 | 401 | 399 | 399 | 399 | 401 | 399 | 399 | 399 | 399 | 399 |
| 4 | 401 | 399 | 401 | 401 | 401 | 399 | 401 | 401 | 401 | 401 |
| 5 | 401 | 399 | 401 | 401 | 399 | 399 | 401 | 399 | 399 | 399 |
| 6 | 401 | 401 | 401 | 399 | 399 | 401 | 401 | 401 | 401 | 401 |
| 7 | 401 | 401 | 401 | 399 | 399 | 401 | 399 | 399 | 399 | 399 |
| 8 | 401 | 399 | 401 | 399 | 401 | 401 | 399 | 399 | 399 | 399 |
| 9 | 401 | 399 | 399 | 401 | 401 | 399 | 401 | 399 | 399 | 399 |
| 10 | 399 | 401 | 399 | 401 | 399 | 401 | 399 | 399 | 399 | 401 |

Figure 4

METHOD OF REDUCING EMISSION OF ELECTROMAGNETIC RADIATION ON HIGH SPEED COMMUNICATION BACKPLANE

CROSS-REFERENCE TO RELATED APPLICATIONS

The present application claims the benefit under 35 U.S.C. §119 from U.S. Provisional Application No. 61/295,370, filed Jan. 15, 2010, and claims priority to Norwegian Patent Application No. NO20100064, filed Jan. 15, 2010, which are both herein incorporated by reference in their entirety.

TECHNOLOGICAL FIELD

The exemplary embodiments described herein generally relate to EMC (Electro-Magnetic Compatibility) and in particular to a method of reducing emission of electromagnetic radiation.

BACKGROUND

Electronic equipment used in home, office or central office must meet regulatory standards for Electro-Magnetic Compatibility (EMC) in the country where the equipment is sold and used. Exemplary standards include FCC Part 15 in the USA and EN55022 in the EU.

EMC generally pursues two different issues, emission and immunity. Emission issues are related to the unwanted generation of electromagnetic energy by some source, and to the countermeasures which should be taken in order to reduce such generation and to avoid the escape of any remaining energies into the external environment. Immunity or susceptibility issues, in contrast, refer to the correct operation of electrical equipment, often referred to as the victim, in the presence of unplanned electromagnetic disturbances.

Before EMC-approval, different tests targeting both emission and immunity issues are performed. Radiated emission tests measure electromagnetic output from the product, that is, both intentional and undesired electromagnetic radiation. EMC measurement standards commonly set limits on how much power a product may emit over a given set of frequencies. Radiating too much at a given frequency may have adverse effects on nearby electronic equipment or radio transmissions. Immunity tests, on the other hand, ensure that the product will not malfunction when exposed to reasonable amounts of electromagnetic noise or interference (EMI) from nearby equipment.

Any equipment exceeding a limit on radiated emission at a given frequency may not be sold and used where the limit applies. For some types of electronic circuits, in particular when equipment comprises a large number of circuits operating at a same fixed frequency, these limits may be very difficult to meet.

One method of reducing radiated emissions is to enclose the equipment in a grounded metal chassis. However, breaches in the chassis may allow electromagnetic emissions to escape or leak out. This is a particular problem for equipment that has removable and replaceable parts. An example of such an equipment is shown in FIG. 1, which depicts a highly scalable and flexible chassis-based platform for high-definition video conferencing and voice communication 1. Ten different modules 2, or "blades," may be plugged into the chassis, where the blades may be ISDN gateways, MCUs, Telepresence servers, and supervisor modules. The chassis shown in FIG. 1 further comprises a backplane having 180 connections for high speed communication between the blades, wherein each of the connections operate at 6.4 Gb/s.

Electromagnetic radiation at high frequencies, such as in the GHz range (1 Gbps serial communication yields 1 GHz electromagnetic radiation), has a short wavelength, typically in the cm-range (e.g. 6.4 GHz gives a wavelength of approximately 4.5 cm). Hence, the radiation is able to pass through any small slots or gaps in the chassis. In addition to gaps or small slots, which are almost impossible to avoid in products manufactured from sheet metal, holes in the chassis for cooling, etc. can also make it almost impossible to rely on a grounded metal chassis to avoid excessive electromagnetic radiation when communicating on very high frequencies.

A second method of reducing radiated emission is to slow down the speed of the communication, i.e., to reduce the clocking frequency of the communication. For real-time, processing-intensive applications, such as high definition video conferencing, this is clearly not a viable solution.

A third common method for reducing emission of electromagnetic radiation at a given frequency is spread spectrum clock generation (SSCG). Clock driven systems have a narrow frequency spectrum due to the periodicity of the clock. A perfect clock signal would have all the energy of the clock concentrated at a single frequency and at its harmonics, and would therefore radiate energy with an infinite spectral density. Practical synchronous digital systems radiate electromagnetic energy on a number of narrow bands spread at the clock frequency and its harmonics, resulting in a frequency spectrum that, at certain frequencies, can exceed regulatory limits. SSCG modulates the frequency of the clock within a device when transmitting so that the bandwidth of the emissions is increased and therefore an average, or quasi-peak, receiver measurement centered at a given frequency is reduced, i.e., there is a reduction in spectral density. However, in some systems, altering the reference clock has a detrimental effect on the stability of transceivers in the system. Further, in a system having several blades, as depicted in FIG. 1, additional and complex hardware would be required to synchronize the reference clock modulation between the blades.

Further, SSCG does not reduce the total energy radiated by a system and therefore does not necessarily make the system less likely to cause interference. SSCG merely takes advantage of the EMC testing procedures, wherein the measuring receivers used by EMC testing laboratories divide the electromagnetic spectrum into narrow frequency bands. A clock-driven system would typically radiate all of the system energy into one frequency and its harmonics, and thus the measuring receivers would register a large peak at the monitored frequency band, thereby increasing the likelihood for exceeding statutory limits. SSCG, on the other hand, distributes the energy so that the energy falls into a large number of the receiver's frequency bands, without putting enough energy into any one band to exceed the statutory limits.

SUMMARY

An aspect of the technological advancement is a method that includes transmitting data to a backplane from a first communication module simultaneously on a first pair of operating frequencies, the first pair of operating frequencies including first and second operating frequencies. The method further provides that a −3 dB point of a first electromagnetic emission spectrum peak originating from transmission of the data at the first operating frequency is outside a −3 dB point of a second electromagnetic emission spectrum peak originating from transmission of the data at the second operating frequency.

Another aspect of the technological advancement is a system that has a backplane and first and second communication modules connected to the backplane, where the first communication module is configured to transmit data to the backplane simultaneously on a first pair of operating frequencies. The first pair of operating frequencies includes first and second operating frequencies, and a −3 dB point of a first electromagnetic emission spectrum peak originating from transmission of the data at the first operating frequency is outside a −3 dB point of a second electromagnetic emission spectrum peak originating from transmission of the data at the second operating frequency.

A further aspect of the technological advancement is a non-transitory computer-readable medium encoded with instructions that, when executed by a computer, cause the computer to perform a method including transmitting data to a backplane from a first communication module simultaneously on a first pair of operating frequencies. The first pair of operating frequencies includes first and second operating frequencies, and a −3 dB point of a first electromagnetic emission spectrum peak originating from transmission of the data at the first operating frequency is outside a −3 dB point of a second electromagnetic emission spectrum peak originating from transmission of the data at the second operating frequency.

It is to be understood that both the foregoing general description of the invention and the following detailed description are exemplary, and are not restrictive of the invention.

BRIEF DESCRIPTION OF THE DRAWINGS

Other aspects and features of the present technological advancement will become apparent to those of ordinary skill in the art upon review of the following description of exemplary embodiments in conjunction with the accompanying figures.

FIG. 4 shows an exemplary reference clock pre-configuration.

DETAILED DESCRIPTION

The following description is presented to enable a person of ordinary skill in the art to make and use the various aspects and examples of the present technological advancement. Descriptions of specific devices, techniques, and applications are provided only as examples. Various modifications to the examples described herein will be readily apparent to those of ordinary skill in the art, and the general principles defined herein may be applied to other examples and applications.

In the following detailed description an exemplary device according to the present technological advancement is referred to as a Static Discrete Spread Spectrum system (SDSS). An SDSS operates on multiple pairs of operating frequencies, where each pair of operating frequencies is selected according to two conditions. First, the first operating frequency and the second operating frequency are close enough in frequency that transmitters and receivers using the first operating frequency of the pair can communicate with transmitters and receivers using the second operating frequency of the pair. Secondly, the first and second operating frequencies are at least separated in frequency so that an electromagnetic (EM)-emission spectrum peak originating from transmission of data at the first operating frequency is outside the −3 dB point of an EM-emission spectrum peak originating from transmission of data at the second frequency. A second pair of operating frequencies is selected so that transmitters and receivers using the second pair of operating frequencies cannot communicate with the transmitters and receivers using the first pair of operating frequencies.

Figure 1:
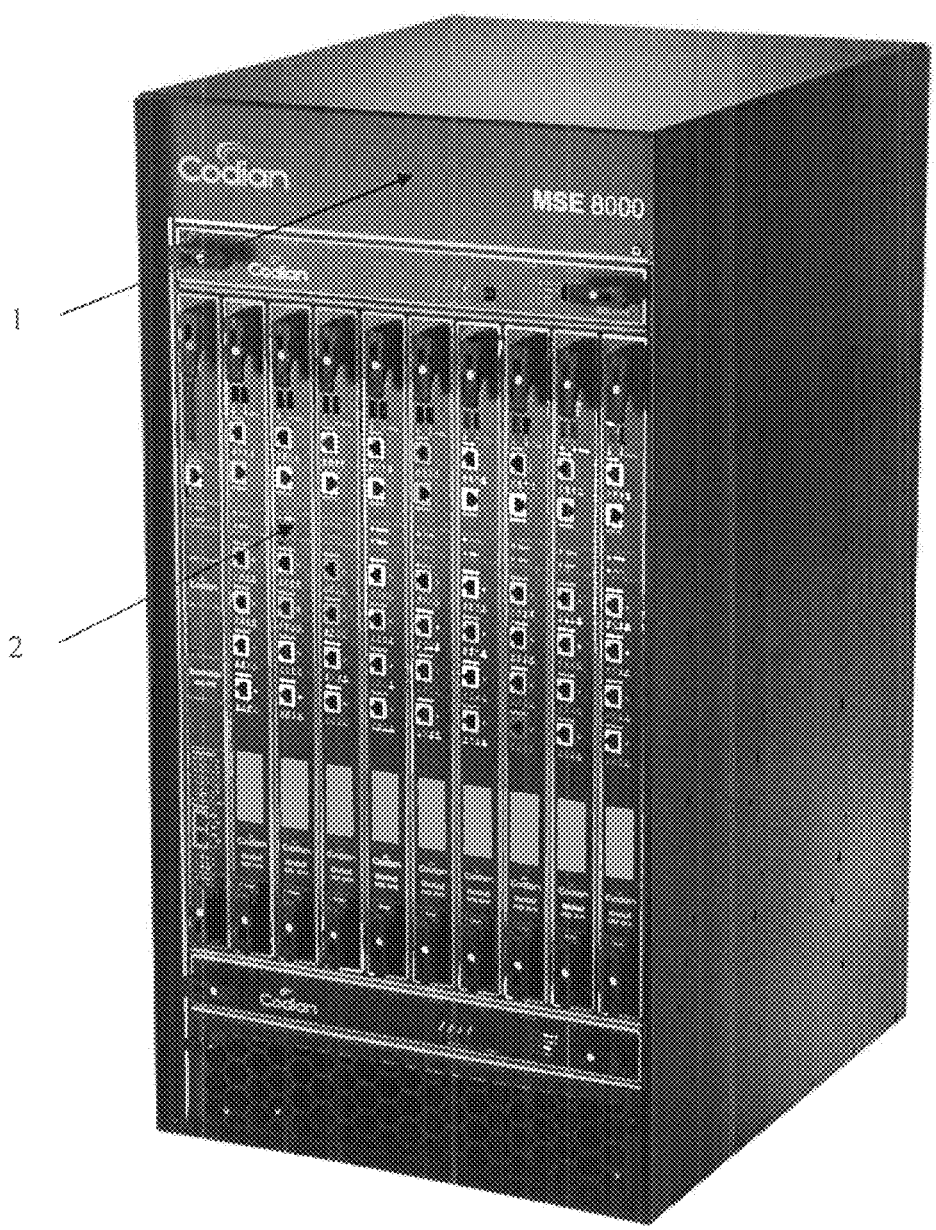
FIG. 1 shows a flexible, chassis-based platform for high-definition video conferencing and voice communication.
Figure 2:
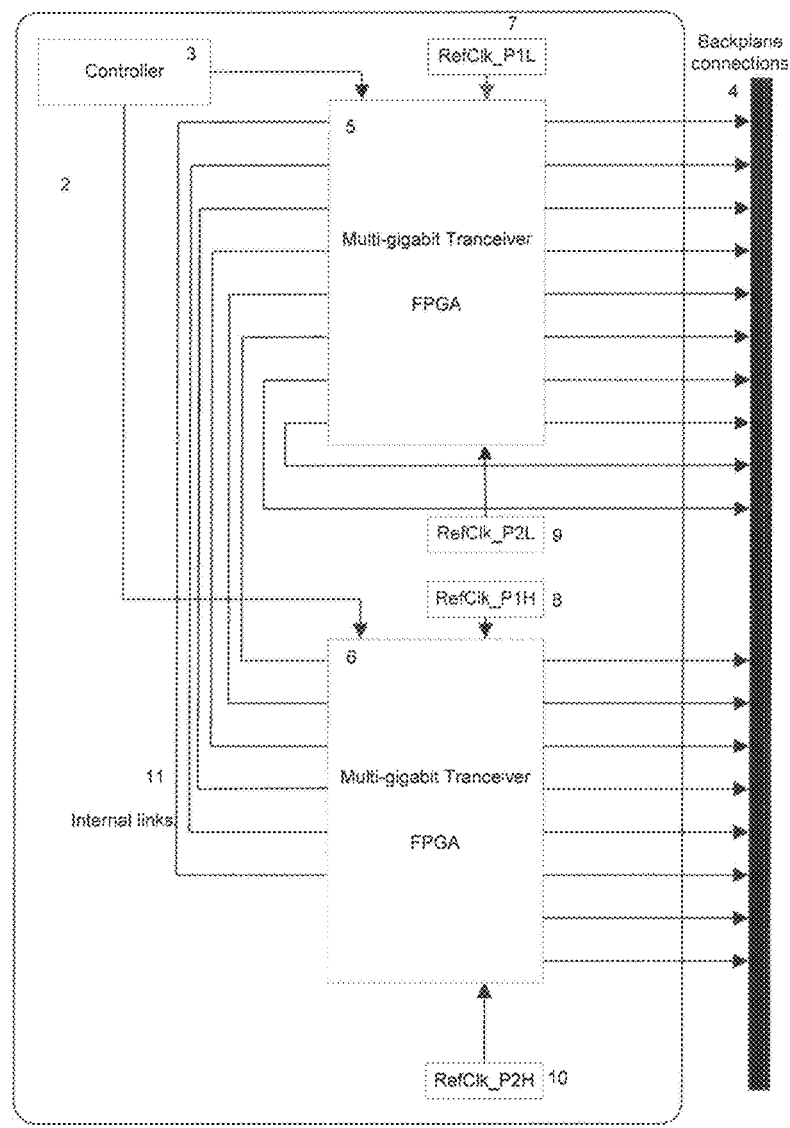
FIG. 2 is a schematic block diagram of an exemplary embodiment of the present technological advancement.

FIG. 2 shows an exemplary hardware module 2, in the following referred to as a "blade.". The blade 2 includes a blade controller 3, two multi-gigabit transceivers (MGTs) 5 and 6, a plurality of internal links 11 connecting the MGTs, four reference clocks or oscillator modules 7-10, and a plurality of connections 4 for multi-gigabit per second speed communication between blades 2.

An MGT transmits parallel data as a stream of serial bits, and converts received serial bits to parallel data. The most basic performance metric of an MGT is serial bit rate, or operating frequency, which is the number of serial bits the MGT can transmit or receive in 1 second. An MGT typically runs at operating frequencies of 1 GHz or more, which corresponds to line rates of 1 Gigabit/second or more.

An MGT typically includes a Serializer/Deserializer (SerDes), an encoder/decoder, a transmit buffer, a receive buffer and a clock data recovery (CDR). When an MGT receives serial data, the MGT uses the same serial clock that serialized the data to deserialize the data. A receiving MGT recovers the clock signal from the data directly, using transitions in the data to adjust the rate of the receiving MGT's local serial clock so that the receiving MGT's clock is locked at the rate used by the transmitting MGT.

A small frequency difference always exists between reference clock sources, even if the reference clock sources are nominally at the same frequency. As a result, in systems where each MGT uses its own reference clock, each MGT uses a slightly different frequency for transmitting data. These small frequency differences are handled using clock correction. In clock correction, each MGT includes an asynchronous FIFO buffer. Received data (RX) are written to the FIFO buffer using the parallel clock from the CDR, and read from the FIFO buffer using the parallel clock from the rest of the system (the local clock). Since the CDR clock and the local clock are not exactly the same, the FIFO buffer will eventually overflow or underflow unless it is corrected. To enable correction, each MGT periodically transmits one or more special characters, or pads, which the receiver can remove or replicate in the FIFO buffer as necessary. By removing characters when the FIFO buffer is too full and replicating characters when the FIFO buffer is too empty, the receiver can prevent overflow/underflow. However, when the frequency difference between the local clock and the CDR clock is too large, the clock correction eventually fails. The range of CDR clock frequencies for which an MGT is able to perform clock correction is in the following referred to as the operating frequency range of the MGT, and the local clock frequency of the MGT is referred to as the center operating frequency (COF) of the MGT.

The ability of an MGT to receive data at a range of operating frequencies may be utilized to transmit data at two different transmitting frequencies to a single receiver having a center operating frequency (COF), where the first transmitting frequency is lower (lower operating frequency (LOF))

than the COF and the second transmitting frequency is higher (higher operating frequency (HOF)) than the COF, and both the first and second transmitting frequencies are within the operating frequency range of the MGT. The MGT uses clock correction as described above to handle the LOF to HOF frequency differences.

According to another embodiment, more padding is added to the data transmitted at the high frequency than to the data transmitted at the low frequency.

Transmission of data at either operating frequency causes emission of electromagnetic radiation at the operating frequencies and their harmonics, giving rise to peaks in an electromagnetic spectrum corresponding to the different operating frequencies. MGTs transmit scrambled data continuously, i.e., a data packet is indistinguishable from an idle packet. Thus, the amount of energy emitted at a certain frequency, i.e., the height of a peak in the electromagnetic spectrum, is a function of the number of transceivers operating at that frequency.

The peak radiated electromagnetic energy for transmitting data to a receiver having an operating frequency range may be reduced by transmitting the data at two different operating frequencies, a low operating frequency (LOF) and a high operating frequency (HOF). Both the LOF and the HOF are within an operating frequency range of the receiver, and the LOF and the HOF are at least separated in frequency so that an electromagnetic (EM)-emission spectrum peak originating from transmission of data at the LOF is outside the −3 dB point of an EM-emission spectrum peak originating from transmission of data at the HOF.

Another exemplary embodiment is a system including at least one first receiver having a first operating frequency range and at least one second receiver having a second operating frequency range, the second operating frequency range being different than the first operating frequency range. This system reduces the peak radiated electromagnetic energy by transmitting data at four different operating frequencies, where a first low operating frequency and a first high operating frequency are within the first operating frequency range of the at least one first receiver. The first low operating frequency and the first high operating frequency are at least separated in frequency so that an EM-emission spectrum peak originating from transmission of data at the first low operating frequency is outside the −3 dB point of an EM-emission spectrum peak originating from transmission of data at the first high operating frequency. The second low operating frequency and a second high operating frequency are within the second operating frequency range of the at least one second receiver, and the second low operating frequency and the second high operating frequency are at least separated in frequency so that an EM-emission spectrum peak originating from transmission of data at the second low operating frequency is outside the −3 dB point of an EM-emission spectrum peak originating from transmission of data at the second high operating frequency.

Again, with reference to FIG. 2, reference clocks RefClk_P1L 7 and RefClk_P1H 8 constitute a first reference clock frequency pair having a center clock frequency RefClk_P1. Correspondingly, reference clocks RefClk_P2L 9 and RefClk_P2H 10 constitute a second reference clock frequency pair having a center frequency RefClk_P2. One reference clock from each of the reference clock frequency pairs is connected to each of the MGTs, e.g., RefClk_P1L and RefClk_P2L are connected to the first MGT 5, and RefClk_P1H and RefClk_P2H are connected to the second MGT 6. Using the four different reference clocks, the two MGTs transmit data at four different operating frequencies, or, more specifically, at two pairs of operating frequencies. The first pair of operating frequencies corresponds to the first reference clock frequency pair, in which COF_P1, LOF_P1 and HOF_P1 correspond to operating frequencies obtained using reference clock frequencies RefClk_P1, RefClk_P1L and RefClk_P1H, respectively. The second pair of operating frequencies corresponds to the second reference clock frequency pair, wherein COF_P2, LOF_P2 and HOF_P2 correspond to operating frequencies obtained using reference clock frequencies RefClk_P2, RefClk_P2L and RefClk_P2H, respectively.

Figures 3A, 3B:
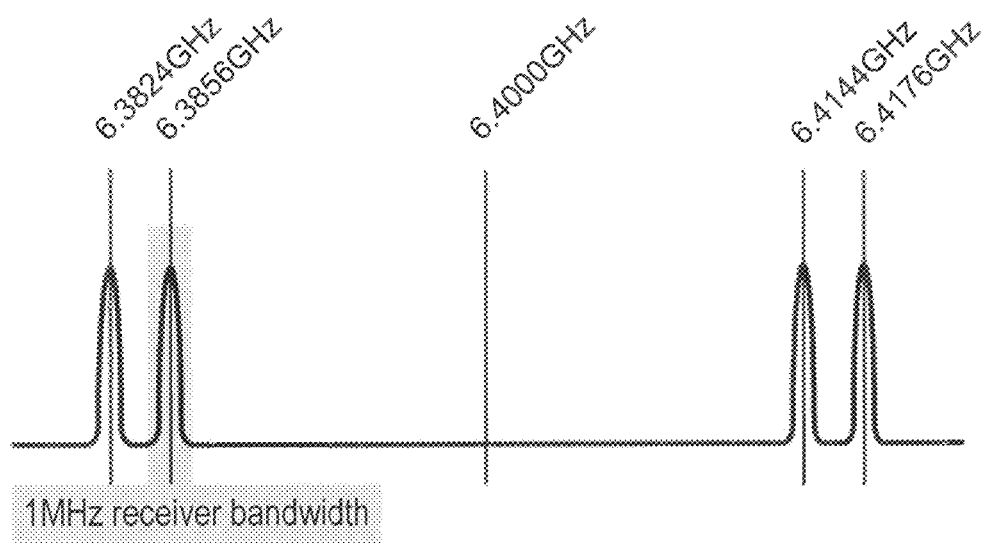
FIG. 3A is a table that includes operational frequencies of an exemplary embodiment of the present technological advancement.
FIG. 3B shows an exemplary electromagnetic radiation spectrum of an exemplary embodiment of the present technological advancement.

An exemplary embodiment may include ten blades and a backplane having 180 connections, each connection operating at approximately 6.4 GHz. FIG. 3A is a table of the four different reference clock frequencies, RefClk_P1L, RefClk_P1H, RefClk_P2L and RefClk_P2H, and corresponding operation frequencies, LOF_P1, HOF_P1, LOF_P2 and HOF_P2, respectively. These values are illustratively represented in the chart of FIG. 3B, which shows the four EM-spectrum peaks originating from transmission of data at the four operating frequencies. As can be seen in FIG. 3B, there are two pairs of EM-spectrum peaks, where the peak-center-to-peak-center distance is 3.2 MHz (equals a bit rate of 3.2 Mbps). A measuring receiver used by an EMC testing laboratory in the 6-7 GHz range typically has a measurement bandwidth of approximately 1 MHz and, as shown in FIG. 3B, the −3 dB point of the first peak is clearly separated from the −3 dB point of the neighboring peak.

In a chassis comprising at least one transmitting blade and at least one receiving blade, the lowest possible radiated EM-power is obtained by the blade controller 3 instructing the MGTs of a transmitting blade to transmit using either reference clock RefClk_P1 or reference clock RefClk_P2 based on the positions of both the transmitting blade and a destination blade in the chassis. Then, if the blade controller 3 instructs the transmitting blade 2 to use reference clock RefClk_P1, the transmitting blade 2 starts to transmit data at operating frequencies LOF_P1 and HOF_P1. Alternatively, if the transmitting blade 2 is instructed to use reference clock RefClk_P2, the blade starts to transmit data at operating frequencies LOF_P2 and HOF_P2.

The blade controller's selection of reference clock RefClk_P1 or reference clock RefClk_P2 is based on the positions of both the transmitting blade and a destination blade in the chassis, which in turn is based on a pre-configuration of the blade controller. The pre-configuration of the blade controller is the configuration yielding the lowest possible radiated EM-power typically resulting from computer simulations and/or EM radiation measurements. One exemplary pre-configuration is shown in FIG. 4, also with reference to FIGS. 3A and 3B, where 52 links are centered on RefClk_P2 and 48 links are centered on RefClk_P1, yielding the lowest possible radiated EM-power for this particular hardware configuration.

Other features and advantages will be apparent to those skilled in the art. The foregoing system overview represents some exemplary implementations, but other implementations will be apparent to those skilled in the art, and all such alternatives are deemed equivalent and within the spirit and scope of the present invention, only as limited by the claims.

The invention claimed is:

1. A method, comprising:

transmitting data to a backplane from a first communication module simultaneously on a first pair of operating frequencies, the first pair of operating frequencies including first and second operating frequencies, wherein a −3 dB point of a first electromagnetic emission spectrum peak originating from transmission of the data at the first operating frequency is outside a −3 dB point of a second electromagnetic emission spectrum peak originating from transmission of the data at the second operating frequency; and selecting a pair of reference clocks, from among at least two pairs of reference clocks, where each pair of reference clocks has a center clock frequency and lower and upper clock frequencies, wherein the first and second operating frequencies respectively correspond to the lower and upper clock frequencies of a selected pair of reference clocks.

2. The method according to claim 1, further comprising:

receiving, from the backplane at a second communication module, the data from the first communication module at the first pair of operating frequencies.

3. The method according to claim 1, further comprising:

transmitting the data to the backplane from the first communication module simultaneously on a second pair of operating frequencies, including third and fourth operating frequencies different from the first and second operating frequencies, wherein a −3 dB point of a third electromagnetic emission spectrum peak originating from transmission of the data at the third operating frequency is outside a −3 dB point of a fourth electromagnetic emission spectrum peak originating from transmission of the data at the fourth operating frequency.

4. The method according to claim 3, further comprising:

receiving, from the backplane at a third communication module, the data from the first communication module at the second pair of operating frequencies.

5. The method according to claim 4, further comprising:

selecting to transmit at one of the first pair of operating frequencies and the second pair of operating frequencies, wherein said selecting is based on a position of a transmitting communication module on the backplane and a position of a receiving communication module on the backplane.

6. The method according to claim 2, further comprising:

at the first communication module, adding more pad bytes to the data transmitted at the second frequency than to the data transmitted at the first frequency, wherein the second frequency is higher than the first frequency.

7. The method according to claim 4, further comprising:

at the first communication module, adding more pad bytes to the data transmitted at the fourth frequency than to the data transmitted at the third frequency, wherein the fourth frequency is higher than the third frequency.

8. The method according to claim 2, further comprising:

performing clock data recovery and clock correction to align the data received at the second communication module with a local clock of the second communication module.

9. The method according to claim 4, further comprising:

performing clock data recovery and clock correction to align the data received at the second communication module with a local clock of the third communication module.

10. The method according to claim 2, wherein each of the first and second communication modules includes a Multi-Gigabit Transceiver (MGT).

11. A system, comprising:

a backplane;

first and second communication modules connected to the backplane, wherein the first communication module is configured to transmit data to the backplane simultaneously on a first pair of operating frequencies, the first pair of operating frequencies including first and second operating frequencies, a −3 dB point of a first electromagnetic emission spectrum peak originating from transmission of the data at the first operating frequency is outside a −3 dB point of a second electromagnetic emission spectrum peak originating from transmission of the data at the second operating frequency, and each of the first and second communication modules includes two transceivers, and two pairs of reference clocks, each reference clock pair having a center clock frequency, a first reference clock pair having a lower center clock frequency than a second reference clock pair, a lower clock frequency of each reference clock pair being connected to a first one of the two transceivers and a higher clock frequency of each reference clock pair being connected to a second one of the two transceivers.

12. The system according to claim 11, wherein the second communication module is configured to receive data from the first communication module at the first pair of operating frequencies.

13. The system according to claim 11, wherein the two transceivers are Multi-Gigabit Transceivers (MGTs), and each of the first and second communication modules includes a controller connected to each of the MGTs that instructs the MGTs to select either the first reference clock pair or the second reference clock pair.

14. A non-transitory computer-readable medium encoded with instructions that, when executed by a computer, cause the computer to perform a method comprising:

transmitting data to a backplane from a first communication module simultaneously on a first pair of operating frequencies, the first pair of operating frequencies including first and second operating frequencies, wherein a −3 dB point of a first electromagnetic emission spectrum peak originating from transmission of the data at the first operating frequency is outside a −3 dB point of a second electromagnetic emission spectrum peak originating from transmission of the data at the second operating frequency; and selecting a pair of reference clocks, from among at least two pairs of reference clocks, where each pair of reference clocks has a center clock frequency and lower and upper clock frequencies, wherein the first and second operating frequencies respectively correspond to the lower and upper clock frequencies of a selected pair of reference clocks.

15. The medium according to claim 14, the method further comprising:
   transmitting the data to the backplane from the first communication module simultaneously on a second pair of operating frequencies, including third and fourth operating frequencies different from the first and second operating frequencies,
   wherein a −3 dB point of a third electromagnetic emission spectrum peak originating from transmission of the data at the third operating frequency is outside a −3 dB point of a fourth electromagnetic emission spectrum peak originating from transmission of the data at the fourth operating frequency.

16. The medium according to claim 15, the method further comprising:
   selecting to transmit at one of the first pair of operating frequencies and the second pair of operating frequencies,
   wherein said selecting is based on a position of a transmitting communication module on the backplane and a position of a receiving communication module on the backplane.

17. The medium according to claim 15, the method further comprising:
   at the first communication module, adding more pad bytes to the data transmitted at the fourth frequency than to the data transmitted at the third frequency, or
   at the first communication module, adding more pad bytes to the data transmitted at the second frequency than to the data transmitted at the first frequency.

18. The medium according to claim 14, the method further comprising:
   performing clock data recovery and clock correction to align data received at a second communication module with a local clock of the second communication module.

19. The medium according to claim 15, the method further comprising:
   performing clock data recovery and clock correction to align data received at a second communication module with a local clock of a third communication module.

20. The medium according to claim 19, wherein each of the first and second communication modules includes a Multi-Gigabit Transceiver (MGT).

* * * * *